(12) United States Patent
Ogawa

(10) Patent No.: US 10,770,408 B2
(45) Date of Patent: Sep. 8, 2020

(54) WIRING BOARD AND SEMICONDUCTOR DEVICE

(71) Applicant: SHINKO ELECTRIC INDUSTRIES CO., LTD., Nagano (JP)

(72) Inventor: Masayuki Ogawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 21 days.

(21) Appl. No.: 16/393,056

(22) Filed: Apr. 24, 2019

(65) Prior Publication Data
US 2019/0348374 A1 Nov. 14, 2019

(30) Foreign Application Priority Data
May 8, 2018 (JP) ................. 2018-089904

(51) Int. Cl.
| | | |
|---|---|---|
| H01L 23/49 | (2006.01) | |
| H01L 23/00 | (2006.01) | |
| H01L 21/48 | (2006.01) | |
| H01L 23/498 | (2006.01) | |

(52) U.S. Cl.
CPC ........ *H01L 23/562* (2013.01); *H01L 21/4846* (2013.01); *H01L 23/49838* (2013.01); *H01L 24/16* (2013.01); *H01L 2224/16227* (2013.01); *H01L 2924/3511* (2013.01)

(58) Field of Classification Search
CPC ... H01L 23/562; H01L 24/16; H01L 21/4846; H01L 23/49838; H01L 2924/3511; H01L 2224/16227; H01L 23/49816; H01L 23/49811; H01L 23/49866; H01L 23/49894; H01L 23/145; H01L 23/49822; H05K 2201/03; H05K 3/341
See application file for complete search history.

(56) References Cited

U.S. PATENT DOCUMENTS

| | | | | |
|---|---|---|---|---|
| 2007/0222053 | A1* | 9/2007 | Wei .......................... | H01L 24/12 257/686 |
| 2008/0197173 | A1* | 8/2008 | Kitae ................... | H01L 21/6835 228/180.22 |
| 2010/0147574 | A1* | 6/2010 | Kaneko ................. | H01L 25/105 174/261 |
| 2013/0075893 | A1* | 3/2013 | Herbsommer ........ | H01L 25/072 257/737 |
| 2016/0056119 | A1* | 2/2016 | Hong ...................... | H01L 24/17 257/737 |

(Continued)

FOREIGN PATENT DOCUMENTS

JP   2004-253544   9/2004

*Primary Examiner* — Charles D Garber
*Assistant Examiner* — S M Sohel Imtiaz
(74) *Attorney, Agent, or Firm* — IPUSA, PLLC

(57) ABSTRACT

A wiring board includes an insulating layer, a plurality of pads formed on a surface of the insulating layer, and a chip mounting region defined on a surface of the wiring board formed with the plurality of pads. The plurality of pads are arranged in the chip mounting region. A cavity is formed in a surface of at least some of the plurality of pads. The cavity caves in, from the surface of the at least some of the plurality of pads, toward the insulating layer. The chip mounting region is segmented into a plurality of segmented regions, and a depth of the cavity is different for each of the plurality of segmented regions.

12 Claims, 8 Drawing Sheets

(56) References Cited

U.S. PATENT DOCUMENTS

| | | | |
|---|---|---|---|
| 2016/0079194 A1* | 3/2016 | Chen | H01L 21/4853 |
| | | | 257/737 |
| 2016/0111378 A1* | 4/2016 | Chen | H01L 21/4853 |
| | | | 257/773 |
| 2017/0053878 A1* | 2/2017 | Kajihara | H01L 23/5389 |
| 2017/0103958 A1* | 4/2017 | Lee | H01L 23/562 |
| 2017/0250153 A1* | 8/2017 | Kikuchi | H01L 24/11 |

* cited by examiner

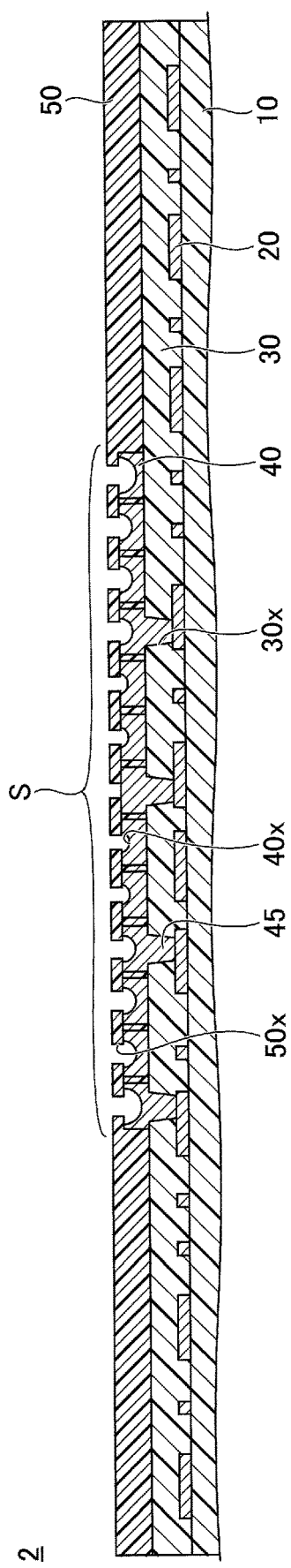

WIRING BOARD AND SEMICONDUCTOR DEVICE

CROSS-REFERENCE TO RELATED APPLICATION

This application is based upon and claims priority to Japanese Patent Application No. 2018-089904, filed on May 8, 2018, the entire contents of which are incorporated herein by reference.

FIELD

Certain aspects of the embodiments discussed herein are related to a wiring board, a method of manufacturing the wiring board, and a semiconductor device.

BACKGROUND

Conventionally, there is a known semiconductor device that includes a semiconductor chip mounted on a chip mounting region of a wiring board. The wiring board and the semiconductor chip are electrically connected via solder bumps respectively formed on the wiring board and the semiconductor chip. As an example, Japanese Laid-Open Patent Publication No. 2004-253544 proposes arranging the solder bumps of the wiring board to oppose the corresponding solder bumps of the semiconductor chip, and melting and thereafter coagulating the solder bumps, to cause alloying of the solder bumps and achieve the electrical connection.

However, when the chip mounting region of the wiring board is warped, a distance between the solder bump of the wiring board and the corresponding solder bump of the semiconductor chip varies depending on the position within the chip mounting region. For this reason, at the position within the chip mounting region, where the distance between the corresponding solder bumps is short, adjacent solder bumps may become connected by the excessive amount of solder. In this first case, there is a high possibility that a solder bridge connecting the adjacent solder bumps will generate a short-circuit. On the other hand, at the position within the chip mounting region, where the distance between the corresponding solder bumps is long, the corresponding solder bumps may not become connected due to insufficient amount of solder. In this latter case, there is a high possibility that the non-connecting, corresponding solder bumps will generate an open-circuit. In other words, because the distance between the solder bump of the wiring board and the corresponding solder bump of the semiconductor chip varies depending on the position within the chip mounting region, a reliability of the connection between the wiring board and the semiconductor chip deteriorates.

SUMMARY

Accordingly, it is an object in one aspect of the embodiments to provide a wiring board, a method of manufacturing the wiring board, and a semiconductor device, which can improve the reliability of the connection between the wiring board and the semiconductor device when mounting the semiconductor chip on the wiring board.

According to one aspect of the embodiments, a wiring board includes an insulating layer; a plurality of pads formed on a surface of the insulating layer; and a chip mounting region defined on a surface of the wiring board formed with the plurality of pads, wherein the plurality of pads are arranged in the chip mounting region, wherein a cavity is formed in a surface of at least some of the plurality of pads, wherein the cavity caves in, from the surface of the at least some of the plurality of pads, toward the insulating layer, and wherein the chip mounting region is segmented into a plurality of segmented regions, and a depth of the cavity is different for each of the plurality of segmented regions.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 7 is a cross sectional view, in part, illustrating an example of the wiring board in a second embodiment.

DESCRIPTION OF EMBODIMENTS

Figure 1:
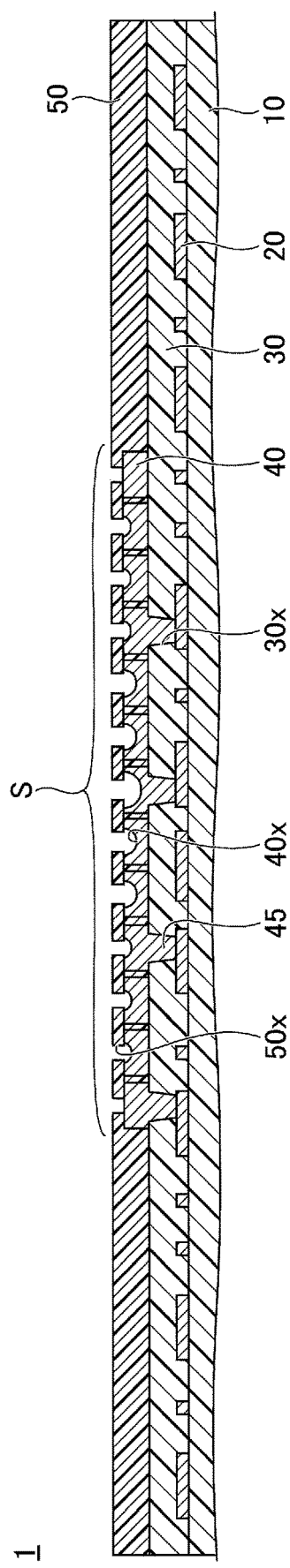
FIG. 1 is a cross sectional view, in part, illustrating an example of a wiring board in a first embodiment.

Preferred embodiments of the present invention will be described with reference to the accompanying drawings. In the drawings, those parts that are the same are designated by the same reference numerals, and a repeated description of the same parts may be omitted.

A description will now be given of a wiring board, a method of manufacturing the wiring board, and a semiconductor device in each embodiment according to the present invention.

First Embodiment

[Structure of Wiring Board in First Embodiment]

First, a structure of the wiring board in a first embodiment will be described. FIG. 1 is a cross sectional view, in part, illustrating an example of the wiring board in the first embodiment. As illustrated in FIG. 1, a wiring board 1 includes an insulating layer 10, a wiring layer 20, an insulating layer 30, pads 40, and a solder resist layer 50. A semiconductor chip (not illustrated) may be mounted on a chip mounting region (or chip mounting area) S of the wiring board 1. The chip mounting region S is defined on a surface of the wiring board 1 formed with the pads 40.

For the sake of convenience in this embodiment, a side of the wiring board 1 provided with the solder resist layer 50 may also be referred to as an upper side or a first side, and an opposite side of the wiring board 1 provided with the insulating layer 10 may also be referred to as a lower side or a second side. In addition, a surface of each part on the side of the solder resist layer 50 may also be referred to as an upper surface or a first surface, and an opposite surface of each part on the side of the insulating layer 10 may also be referred to as a lower surface or a second surface. However, the wiring board 1 may be used in an up-side-down state compared to a state illustrated in FIG. 1, and may also be used at an arbitrary inclination angle. Further, a plan view refers to a view of each part from above in a normal direction to the upper surface of the insulating layer 10, and a planar shape refers to a shape of each part in the view from above in the normal direction to the upper surface of the insulating layer 10.

The insulating layer 10 may be formed by a build-up process, as an interlayer insulator of a multilayer wiring, for example. Accordingly, another insulating layer or another wiring layer may be stacked below the insulating layer 10, as an underlayer. In this case, a suitable via hole may be provided in the insulating layer 10 and the other insulating layer, to electrically connect two or more wiring layers through the via hole.

The insulating layer 10 may be made of epoxy insulating resins, polyimide insulating resins, or the like that are non-photosensitive thermosetting resins, for example. Alternatively, the insulating layer 10 may be made of epoxy insulating resins, acrylic insulating resins, or the like that are photosensitive, for example. The insulating layer 10 may include a reinforcing material such as glass fabrics or the like. In addition, the insulating layer 10 may include a filler, such as silica ($SiO_2$) or the like. The insulating layer 10 may have a thickness of approximately 10 μm to approximately 50 μm, for example.

The wiring layer 20 is famed on the upper surface of the insulating layer 10. The wiring layer 20 may be made of copper (Cu) or the like, for example. The wiring layer 20 may have a thickness of approximately 10 μm to approximately 30 μm, for example. The wiring layer 20 may be connected to the insulating layer 10 that forms an underlayer, through the via holes.

The insulating layer 30 is formed on the upper surface of the insulating layer 10, to cover the wiring layer 20. The material and the thickness used for the insulating layer 30 may be similar to the material and the thickness used for the insulating layer 10, for example. The insulating layer 30 may include a filler, such as silica ($SiO_2$) or the like.

The pads 40 are formed on the upper surface of the insulating layer 30, within the chip mounting region S. The pads 40 may be made of copper (Cu) or the like, for example. The planar shape of each pad 40 may be a circular shape having a diameter of approximately 60 μm to approximately 100 μm, for example. The pads 40 may have a thickness of approximately 10 μm to approximately 30 μm, for example, at a thickest portion thereof. The pads 40 are electrically connected to the wiring layer 20, through via wirings 45 that fill via holes 30x that penetrate the insulating layer 30 and expose the upper surface of the wiring layer 20. Each via hole 30x may form a cavity having an inverted truncated cone shape, with a first opening that opens toward the solder resist layer 30, and an opposite, second opening having a bottom surface formed by the upper surface of the wiring layer 20. The first opening of the via hole 30x has a diameter greater than a diameter of the opposite, second opening of the via hole 30x.

A cavity 40x, that caves in from the upper surface of the pad 40 toward the insulating layer 30, is formed in at least some of the pads 40. The shape of the cavity 40x is not limited to a particular shape, however, the cavity 40x may have a concave shape with an inner wall surface that is formed by a curved surface. Examples of the concave shape with the inner wall surface that is formed by the curved surface include a concave shape having an approximately semi-circular cross section, a concave shape having an approximately semi-oval shape, or the like, for example. The approximately semi-circular shape not only includes a semi-circular shape obtained by bisecting a perfect circular shape, but also includes shapes having a circular arc longer or shorter than that of the semi-circular shape, for example. In addition, the approximately semi-oval shape not only includes a semi-oval shape obtained by bisecting an oval shape, but also includes shapes having a circular arc longer or shorter than that of the oval shape, for example.

The solder resist layer 50 is formed on the upper surface of the insulating layer 30, to cover the pads 40. The solder resist layer 50 may be made of a photosensitive resin, such as epoxy resins, acrylic resins, or the like, for example. The solder resist layer 50 may have a thickness of approximately 10 μm to approximately 30 μm, for example.

The solder resist layer 50 includes openings 50x, and a part of the upper surface of the pad 40, excluding an outer peripheral part of the pad 40, is exposed within the corresponding opening 50x. The pad 40 exposed within the opening 50x may be connected to the semiconductor chip. The planar shape of each opening 50x may be a circular shape having a diameter of approximately 40 μm to approximately 80 μm, for example. If required, a metal layer may be formed on the upper surface of the pads 40 exposed within the openings 50x, or the upper surface of the pads 40 exposed within the openings 50x may be treated by an anti-oxidation treatment, such as an Organic Solderability Preservation (OSP) treatment or the like, for example. Examples of the metal layer that may be formed on the upper surface of the pads 40 exposed within the openings 50x include an Au layer, a metal multi-layer, such as a Ni/Au multi-layer in which a Ni layer and a Au layer are stacked in this order, a Ni/Pd/Au multi-layer in which a Ni layer, a Pd layer, and a Au layer are stacked in this order, or the like, for example.

A solder bump, that becomes an external connection terminal, may be formed on each pad 40 that is exposed within the opening 50x, or on the metal layer or the like formed on each pad 40 that is exposed within the opening 50x. External connection terminals are used to electrically connect the semiconductor chip and the pads 40.

The external connection terminals may be formed at an arbitrary timing, as long as the external connection terminals are formed before mounting the semiconductor chip on the wiring board 1. For example, when forwarding the wiring board 1 as a product, the wiring board 1 may be forwarded after forming the solder bumps on the wiring board 1. Alternatively, when the wiring board 1 is forwarded in a state not formed with the solder bumps, the solder bumps may be formed on the acquired wiring board 1 before mounting the semiconductor chip on the wiring board 1.

Figure 2A:
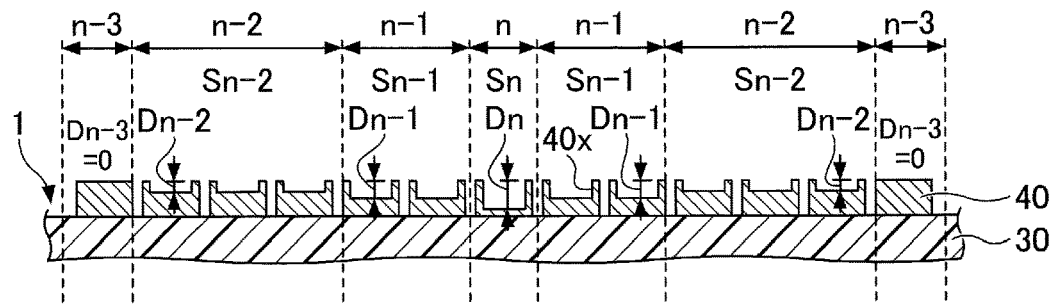
FIG. 2A, FIG. 2B, and FIG. 2C are diagrams for explaining cavities formed in pads of the wiring board in the first embodiment.
Figure 2B:
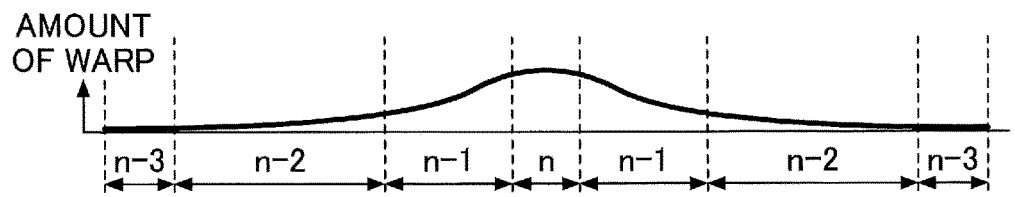
Figure 2C:
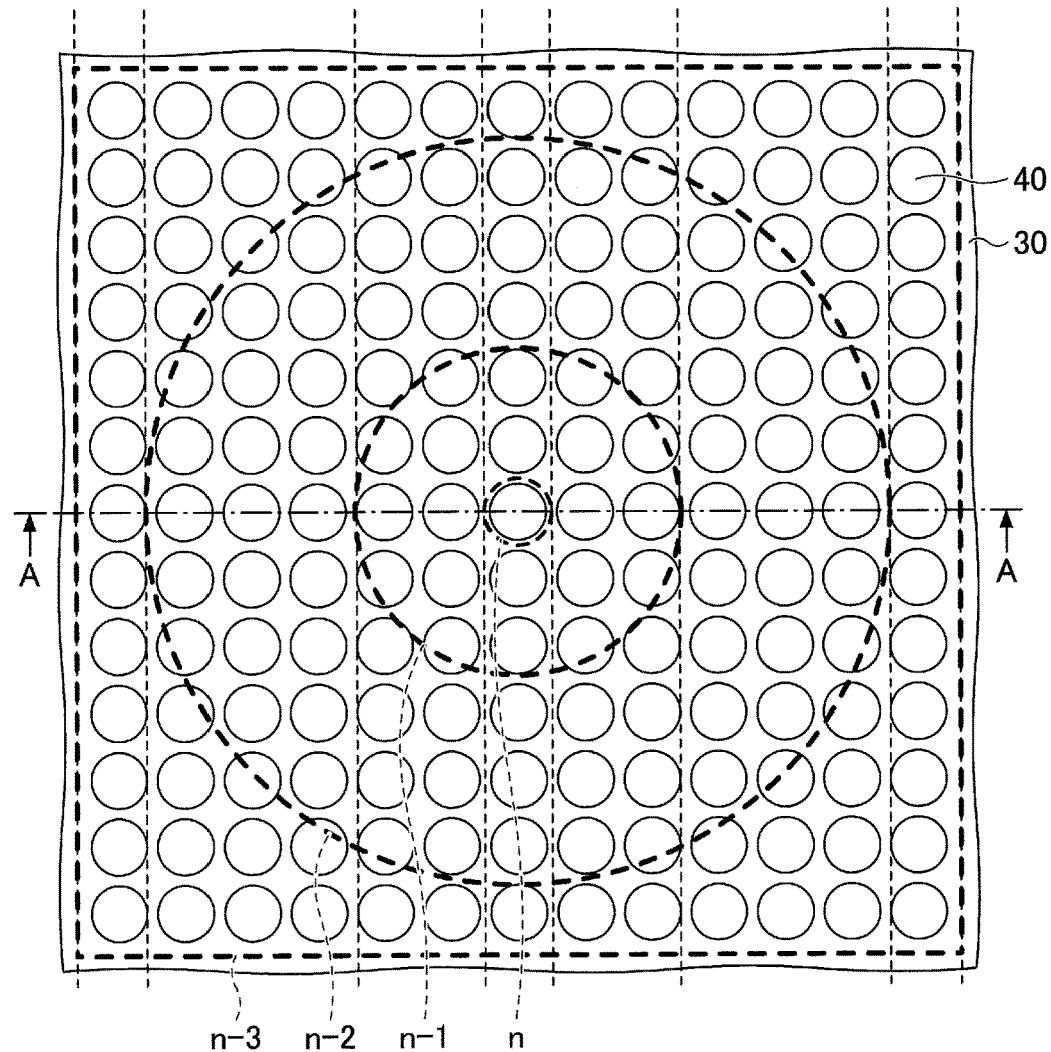
Figure 3:
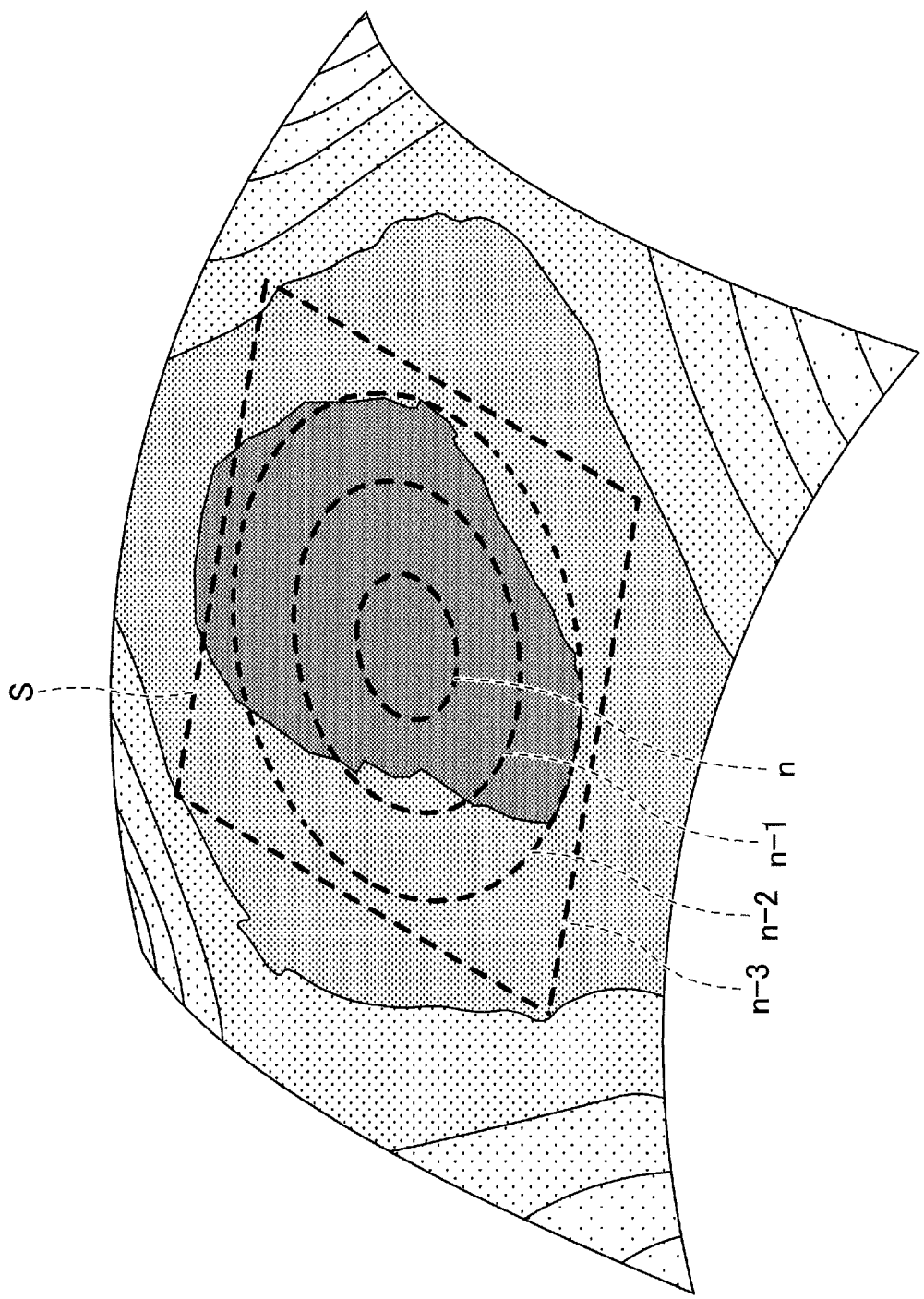
FIG. 3 is a diagram schematically illustrating a warp at a chip mounting region of the wiring board in the first embodiment.

FIG. 2A, FIG. 2B, and FIG. 2C are diagrams for explaining the cavities formed in the pads of the wiring board in the first embodiment. More particularly, FIG. 2A is a cross sectional view, in part, illustrating a vicinity of the chip mounting region S, FIG. 2B is a diagram illustrating an amount of warp in the vicinity of the chip mounting region S, and FIG. 2C is a plan view, in part, illustrating the vicinity of the chip mounting region S. FIG. 2A illustrates the cross section along a line A-A in FIG. 2C. It is assumed for the sake of convenience in FIG. 2A that the cavity 40x has a rectangular cross sectional shape. In addition, FIG. 2B illustrates the amount of warp in the cross section along the line A-A in FIG. 2C. Further, illustration of the cavities 40x is omitted in FIG. 2C. FIG. 3 is a diagram schematically illustrating the warp at the chip mounting region of the wiring board in the first embodiment.

As illustrated in FIG. 2B and FIG. 3, the chip mounting region S of the wiring board 1 is warped so that the side of the pads 40 forms a convex shape. In addition, as illustrated in FIG. 2C, the pads 40 are arranged in an area array within the chip mounting region S of the wiring board 1. In the example illustrated in FIG. 2C, a total of 169 pads 40, in 13 rows by 13 columns, are arranged at approximately regular intervals, that is, are approximately equally spaced, in the chip mounting region S. However, FIG. 2C merely illustrates an example, and the number and manner of arrangement of the pads 40 is not limited to this example. The number and manner of arrangement of the pads 40 may be appropriately determined according to specifications of the semiconductor chip to be mounted on the wiring board 1.

As illustrated in FIG. 2A through FIG. 2C, and FIG. 3, the chip mounting region S is segmented into a plurality of segmented regions. As illustrated in FIG. 2A, a depth of the cavity 40x is different for each of the segmented regions of the chip mounting region S. The "cavities 40x having different depths" include the cavity 40x having a zero depth, that is, a case where no cavity 40x is formed in the pad 40. In the case of the pad 40 arranged at a position spanning adjacent segmented regions of the chip mounting region S, the depth of the cavity 40x may be determined by assuming that this pad 40 belongs to one of the adjacent segmented regions. However, the depth of the cavity 40x in this case may also be determined by assuming that this pad 40 belongs to one of the adjacent segmented regions having a largest area occupied by this pad 40 in the plan view, for example.

In the example illustrated in FIG. 2A through FIG. 2C, the chip mounting region S is segmented into four segmented regions n, n−1, n−2, and n−3. The segmented region n includes the pad 40 located at a center part of the chip mounting region S. The segmented region n−1 is arranged in a doughnut (or ring) shape in contact with an outer periphery of the segmented region n. The segmented region n−2 is arranged in a doughnut shape in contact with an outer periphery of the segmented region n−1. The segmented region n−3 is arranged in a doughnut shape in contact with an outer periphery of the segmented region n−2, and includes the pads 40 located at an outer peripheral part of the chip mounting region S, arranged on an outer side of the segmented region n−2.

The planar shape of the segmented region n may be a circular shape, and the planar shape of each of the segmented regions n−1 and n−2 may be a circular doughnut shape. The segmented regions n, n−1, and n−2 are concentrically arranged with respect to the center part of the chip mounting region S. Of course, the planar shape of the segmented region n may be an oval shape, and in this case, the planar shape of each of the segmented regions n−1 and n−2 may be an oval doughnut shape. In addition, the planar shape of the segmented region n may be a rectangular shape, such as a square shape or the like.

A width $S_n$ of the segmented region n is the narrowest, a width $S_{n-1}$ of the segmented region n−1 is wider than the width $S_n$, and a width $S_{n-2}$ of the segmented region n−2 is wider than the width S. In other words, among the segmented regions n, n−1, and n−2 of the chip mounting region S, excluding the outermost segmented region n−3, the width of the segmented region becomes wider toward an outer edge of the chip mounting region S. Further, among the segmented regions n, n−1, and n−2 of the chip mounting region S, excluding the outermost segmented region n−3, a difference between the widths of the adjacent segmented regions becomes larger toward the outer edge of the chip mounting region S. Accordingly, a relationship $S_{n-1}-S_n <S_{n-2}-S_{n-1}$ stands.

A depth $D_n$ of the cavity 40x formed in the pad 40 that is arranged in the segmented region n is the deepest, a depth $D_{n-1}$ of the cavity 40x formed in each pad 40 that is arranged in the segmented region n−1 is shallower than the depth $D_n$, and a depth $D_{n-2}$ of the cavity 40x formed in each pad 40 that is arranged in the segmented region n−2 is shallower than the depth $D_{n-1}$. In addition, the cavity 40x is not formed in the pads 40 that are arranged in the segmented region n−3, and the depth of the cavity 40x is zero for the pads 40 arranged in the segmented region n−3. In other words, among the segmented regions n, n−1, n−2, and n−3 of the chip mounting region S, the depth $D_n$ of the cavity 40x formed in the pad 40 that is arranged in the segmented region n is the deepest, and the depth of the cavity 40x formed in the pads 40 becomes shallower toward the outer edge of the chip mounting region S. Further, a difference between the depths of the cavities 40x formed in the pads 40 that are arranged in the adjacent segmented regions becomes smaller toward the outer edge of the chip mounting region S. Accordingly, a relationship $D_n-D_{n-1}>D_{n-1}-D_{n-2}>D_{n-2}-D_{n-3}$ stands.

A ratio of the difference between the widths of the adjacent segmented regions, to the difference between the depths of the cavities 40x formed in the pads 40 that are arranged in the adjacent segmented regions, becomes smaller toward the outer edge of the chip mounting region S. In other words, a relationship $(D_n-D_{n-1})/(S_{n-1}-S_n)>(D_{n-1}-D_{n-2})/(S_{n-2}-S_{n-1})$ stands.

As may be seen from the cross sectional view of FIG. 1, the cavity 40x formed in the pad 40 that is arranged in the segmented region n has the largest planar shape, and the planar shape of the cavity 40x formed in each pad 40 that is arranged in the segmented region n−1 is smaller than the planar shape of the cavity 40x formed in the pad 40 that is arranged in the segmented region n. The planar shape of the cavity 40x formed in each pad 40 that is arranged in the segmented region n−2 is smaller than the planar shape of the cavity 40x formed in each pad 40 that is arranged in the segmented region n−1.

In addition, the planar shapes of the cavities 40x formed in the pads 40 that are arranged in each of the segmented regions n, n−1, n−2, and n−3 of the chip mounting region S are larger than the planar shape of each opening 50x in the solder resist layer 50. In the example illustrated in FIG. 1, in the segmented regions n and n−1, the planar shapes of the cavities 40x formed in the pads 40 are larger than the planar shape of each opening 50x. In this case, in the plan view, a peripheral edge part of the opening 50x projects in an eave-shape toward an outer periphery of the cavity 40x.

The width of the segmented regions, the depths of the cavities, and the relationship of the width of the segmented region and the depth of the cavity between the adjacent segmented regions described above may be determined by taking into consideration the features of the convex warp illustrated in FIG. 2B, so that vertex (or apex) positions of the solder bumps lie approximately on the same plane when the solder bumps having a constant volume are formed on each of the pads 40. The features of the convex warp illustrated in FIG. 2B include an amount of warp that is largest at the center part of the chip mounting region S and becomes smaller toward the outer peripheral part of the chip mounting region S, a change in the amount of warp that is large in the vicinity of the center part of the chip mounting region S and becomes more gradual toward the outer peripheral part of the chip mounting region S, or the like. The effect of forming the solder bumps having the constant volume on each of the pads 40 will be described later in more detail by referring to FIG. 5A, FIG. 5B, FIG. 6A, and FIG. 6B.

[Method of Manufacturing Wiring Board in First Embodiment]

Next, a method of manufacturing the wiring board in the first embodiment will be described by mainly referring to processes of forming the cavities 40x in the pads 40. FIG. 4A, FIG. 4B, FIG. 4C, and FIG. 4D are diagrams for explaining examples of manufacturing processes of the wiring board in the first embodiment, and illustrate cross sectional views, in part, illustrating the vicinity of the chip mounting region S. Although the processes of manufacturing a single wiring board is illustrated, it is of course possible to employ processes of forming a plurality of parts respectively corresponding to the wiring board, and cutting the plurality of parts into individual pieces respectively forming the wiring board.

Figure 4A:
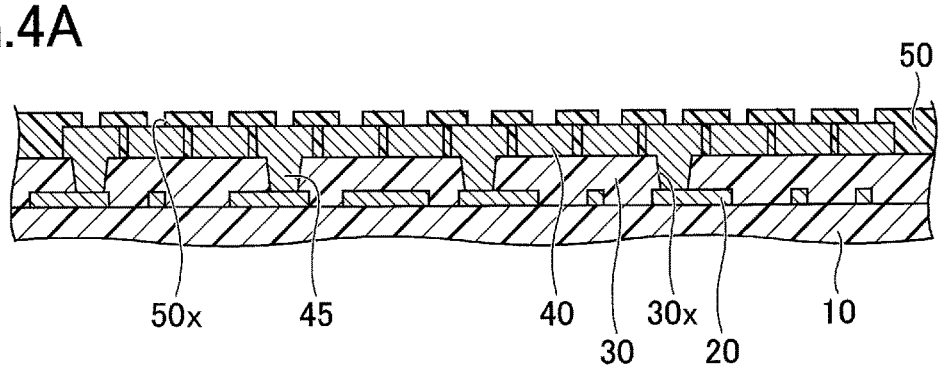
FIG. 4A, FIG. 4B, FIG. 4C, and FIG. 4D are diagrams for explaining examples of manufacturing processes of the wiring board in the first embodiment.

First, in the process illustrated in FIG. 4A, the wiring board 1, including the insulating layer 10, the wiring layer 20, the insulating layer 30, the pads 40, and the solder resist layer 50, is prepared. In the wiring board 1, the pads 40 may be famed in the chip mounting region S by the semi-additive method, for example. The solder resist layer 50 may be formed on the upper surface of the insulating layer 30 to cover the pads 40, by a photosensitive insulating resin or the like in liquid form or film form, for example, and exposing and developing the solder resist layer 50 to form the openings 50x respectively exposing a part of the upper surface of the pad 40. At this stage of the process, no cavity 40x is formed in the pad 40.

Figure 4B:
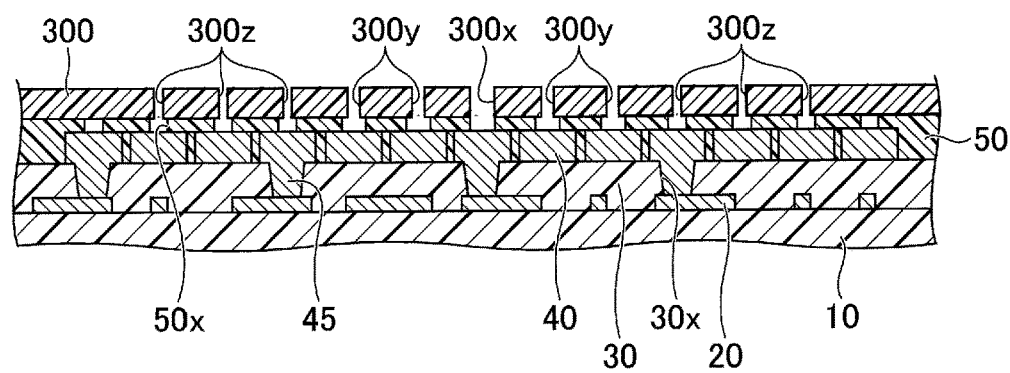

Next, in the process illustrated in FIG. 4B, a resist layer 300 having openings 300x, 300y, and 300z is arranged on the upper surface of the solder resist layer 50. More particularly, a photosensitive dry film resist is arranged on the upper surface of the solder resist layer 50, for example, and this photosensitive dry film is exposed and developed to form the openings 300x, 300y, and 300z. The opening 300x is formed to communicate with the opening 50x that is located in the segmented region n illustrated in FIG. 2A, and the openings 300y are formed to communicate with the openings 50x located in the segmented region n−1 illustrated in FIG. 2A. The openings 300z are formed to communicate with the openings 50x located in the segmented region n−2 illustrated in FIG. 2A. The openings 50x located in the segmented region n−3 illustrated in FIG. 2A are not exposed via the resist layer 300.

In the plan view, the opening 300x has the largest opening area, the opening area of each opening 300y is smaller than the opening area of the opening 300x, and the opening area of each opening 300z is smaller than the opening area of each opening 300y. The planar shapes of the openings 300x, 300y, and 300z are circular shapes, for example. In this case, the opening 300x has the largest diameter, the diameter of each opening 300y is smaller than the diameter of the opening 300x, and the diameter of each opening 300z is smaller than the diameter of each opening 300y.

Figure 4C:
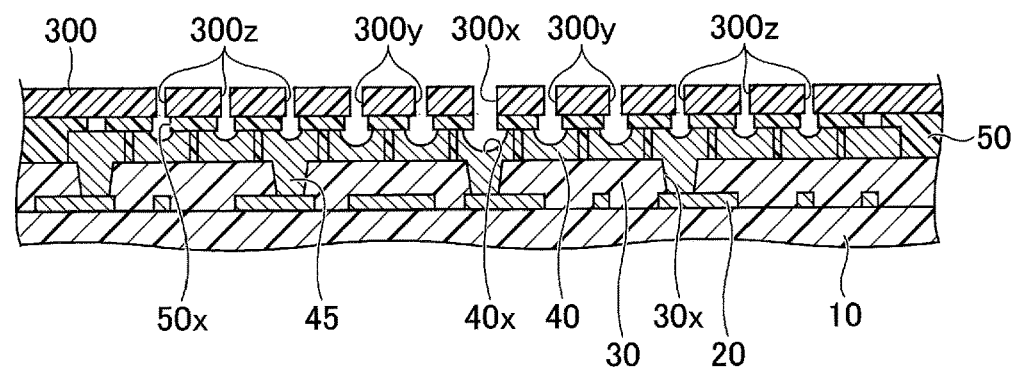

Next, in the process illustrated in FIG. 4C, the resist layer 300 is used as a mask, and the pad 40 exposed within the opening 300x and the opening 50x, the pads 40 exposed, within the openings 300y and the openings 50x, and the pads 40 exposed within the openings 300z and the openings 50x are etched from the upper surfaces of the pads 40, to farm the cavities 40x. Because the opening areas of the openings 300x, 300y, and 300z are different, the larger the opening area of the opening in which the pad 40 is exposed, the deeper and wider the cavity 40x is formed in the pad 40. More particularly, the pad 40 that is exposed within the opening 300x having the largest opening area and the opening 50x, is etched the most, to form the deepest and widest cavity 40x. The pads 40 that are exposed within the openings 300y and the openings 50x, are etched second to most, to form the second deepest and second widest cavities 40x. The pads 40 that are exposed within the openings 300z and the openings 50x, are etched third to most, to tow the third deepest and second widest cavities 40x. In other words, the pads 40 that are exposed within the openings 300z and the openings 50x, are etched the least, to form the shallowest and narrowest cavities 40x.

Examples of the opening diameters and the depths of the cavities 40x when the planar shapes of the openings 300x, 300y, and 300z are circular shapes, may be as follows. When the opening diameter of the opening 300x is 80 μm, the depth $D_n$ of the cavity 40x exposed within the opening 300x is approximately 15 μm. When the opening diameter of the openings 300y are 40 μm, the depth $D_{n-1}$ of the cavities 40x exposed within the openings 300y is approximately 8 μm. When the opening diameter of the openings 300z is 20 μm, the depth $D_{n-2}$ of the cavities 40x exposed within the openings 300z is approximately 3 μm.

When the pads 40 are made of copper, the pads 40 may be etched using a cupric chloride solution, for example. In this case, an isotropic etching is performed, and the pads 40 are simultaneously etched in the depth direction and the width direction. For this reason, the cavity 40x larger than the opening 50x in the plan view, may be formed by adjusting an etching time or the like. In the example illustrated in FIG. 4C, the planar shapes of the cavities 40x is formed larger than the planar shapes of the openings 50x, in each of the segmented regions n, n−1, and n−2 illustrated in FIG. 2A.

Figure 4D:
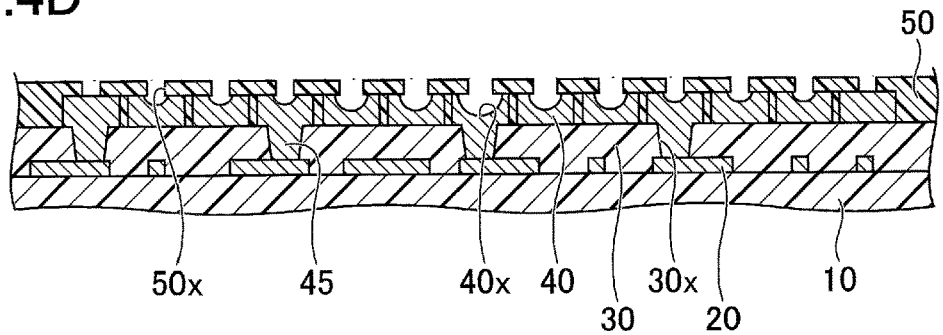

Next, in the process illustrated in FIG. 4D, the resist layer 300 is removed. After removing the resist layer 300, a metal layer may be formed on the upper surface of the pads 40 exposed within the openings 50x, or the upper surface of the pads 40 exposed within the openings 50x may be treated by the OSP treatment or the like, if required, to complete the wiring board 1.

A technical significance of making the depths of the cavities 40x of the pads 40 different for each segmented region of the chip mounting region S will be described.

As illustrated in FIG. 2B, the amount of warp is largest at the center part of the chip mounting region S, and becomes smaller toward the outer peripheral part of the chip mounting region S.

Figure 5A:
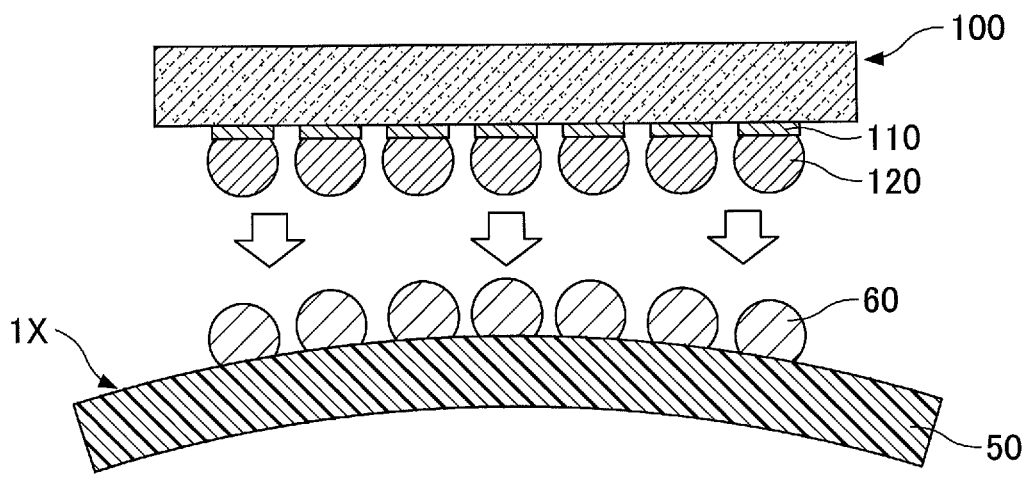
FIG. 5A and FIG. 5B are diagrams for explaining a technical significance of making depths of the cavities of the pads different for each segmented region.

For the sake of convenience, a wiring board 1X having no cavity 40x formed in each pad 40, will be considered as a comparison example. As illustrated in FIG. 5A, solder bumps 60 having a constant volume are formed on the pads 40 that are arranged in a chip mounting region of the wiring board 1X. Because solder balls having a constant diameter are used to form the solder bumps 60, the volumes of the solder bumps 60 consequently become constant. In this case, due to the convex warp at the center part of the chip mounting region, the vertex position of the solder bump 60 becomes the highest at the center part of the chip mounting region, and becomes lower toward the outer peripheral part of the chip mounting region.

In this state, a semiconductor chip 100 having electrodes 110 formed with solder bumps 120 is mounted on the chip mounting region of the wiring board 1X. In this case, the semiconductor chip 100 is made of silicon or the like, and includes no warp. For this reason, a distance between the vertex of the solder bump 60 of the wiring board 1X and the vertex of the solder bump 120 of the semiconductor chip 100 is shortest at the center part of the chip mounting region, and becomes longer toward the outer peripheral part of the chip mounting region.

Figure 5B:
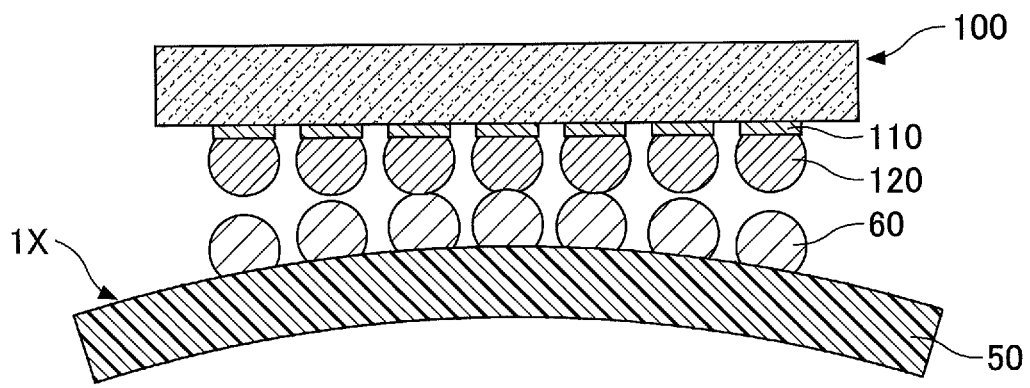

As illustrated in FIG. 5B, when the semiconductor chip 100 is mounted on the chip mounting region of the wiring board 1X, the amount of solder becomes excessive at the center part of the chip mounting region, and there is a high possibility that a solder bridge connecting the adjacent solder bumps will generate a short-circuit. On the other hand, the amount of solder becomes insufficient at the outer peripheral part of the chip mounting region, and there is a high possibility that the solder bump 60 of the wiring board 1X will not be connected to the solder bump 120 of the semiconductor chip 100, to generate an open-circuit. In other words, because the position of the vertex of the solder bump 60 of the wiring board 1X varies between the center part and the outer peripheral part of the chip mounting region, a reliability of the connection between the wiring board 1X and the semiconductor chip 100 deteriorates.

On the other hand, in the wiring board 1, the chip mounting region S is segmented into the plurality of segmented regions, and the depth of the cavity 40x formed in the pad 40 is varied for each of the plurality of segmented regions. In addition, the width of the plurality of segmented regions, the depths of the cavities 40x, and the relationship of the width of the segmented region and the depth of the cavity 40x between the adjacent segmented regions are determined by taking into consideration the features of the convex warp illustrated in FIG. 2B, so that the vertex positions of the solder bumps 60 lie approximately on the same plane when the solder bumps 60 having the constant volume are formed on each of the pads 40.

More particularly, the depth of the cavity 40x formed in the pad 40 that is arranged at the center part of the chip mounting region S is made the deepest, and the depth of the cavity 40x formed in the pads 40 that are arranged in the parts closer to the outer edge of the chip mounting region S are made shallower. In addition, the width of the plurality of segmented regions of the chip mounting region S, except the segmented region (segmented region n−3 in the example described above) forming the outermost region of the chip mounting region S, is wider for the segmented regions located closer to the outer edge of the chip mounting region S. Moreover, the difference between the widths of the adjacent segmented regions, except the segmented region (segmented region n−3 in the example described above) forming the outermost region of the chip mounting region S, is larger for the segmented regions located closer to the outer edge of the chip mounting region S. Further, the difference between the depths of the cavities 40x formed in the pads 40 that are arranged in the adjacent segmented regions, is smaller toward the outer edge of the chip mounting region S. The ratio of the difference between the widths of the adjacent segmented regions, to the difference between the depths of the cavities 40x famed in the pads 40 that are arranged in the adjacent segmented regions, is smaller toward the outer edge of the chip mounting region S.

Figure 6A:
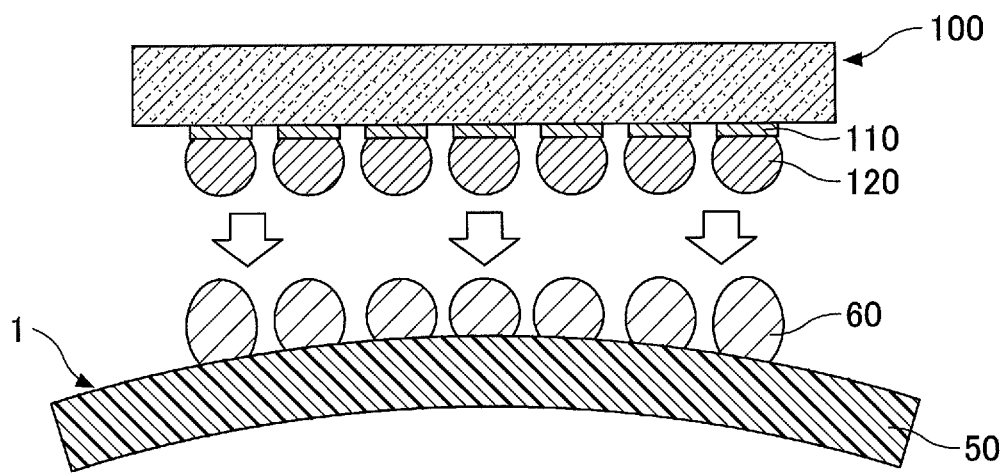
FIG. 6A and FIG. 6B are diagrams for explaining the technical significance of making the depths of the cavities of the pads different for each segmented region.

For this reason, when the solder bumps 60 are formed on the pads 40 that are arranged in the chip mounting region S of the wiring board 1, inconsistencies in the positions of the vertexes of the solder bumps along the height direction caused by the convex warp at the center part of the chip mounting region S in FIG. 2B are canceled, as illustrated in FIG. 6A. The positions of the vertexes of the solder bumps 60 illustrated in FIG. 6A become approximately constant from the center part toward the outer peripheral part of the chip mounting region S. In FIG. 6A, the illustration of the pads 40 is omitted for the sake of convenience. Hence, the depth or the like of the cavities 40x in each of the segmented regions of the chip mounting region S are designed by taking into consideration the amount of warp in the chip mounting region S, so that the positions of the vertexes of the solder bumps 60 become approximately constant from the center part toward the outer peripheral part of the chip mounting region S when the solder bumps 60 are formed on the pads 40.

In this state, the semiconductor chip 100 having the electrodes 110 formed with the solder bumps 120 is mounted on the chip mounting region S of the wiring board 1. In this case, the distance between the vertex of the solder bump 60 of the wiring board 1 and the vertex of the corresponding solder bump 120 of the semiconductor chip 100 is approximately constant from the center part toward the outer peripheral part of the chip mounting region S.

Examples of the depths of the cavities 40x and the heights of the solder bumps 60 may be as follows. When the depth $D_n$ of the cavity 40x is 15 µm, the height of the solder bump 60 is approximately 30 µm. When the depth $D_{n-1}$ of the cavity 40x is 8 µm, the height of the solder bump 60 is approximately 35 µm. When the depth $D_{n-2}$ of the cavity 40x is 3 µm, the height of the solder bump 60 is approximately 38 µm. When the depth $D_{n-3}$ of the cavity 40x is 0 µm, the height of the solder bump 60 is approximately 40 µm. The height of the solder bump 60 in these cases refer to a height from the upper surface of the solder resist layer 50 to the vertex (highest position) of the solder bump 60.

Figure 6B:
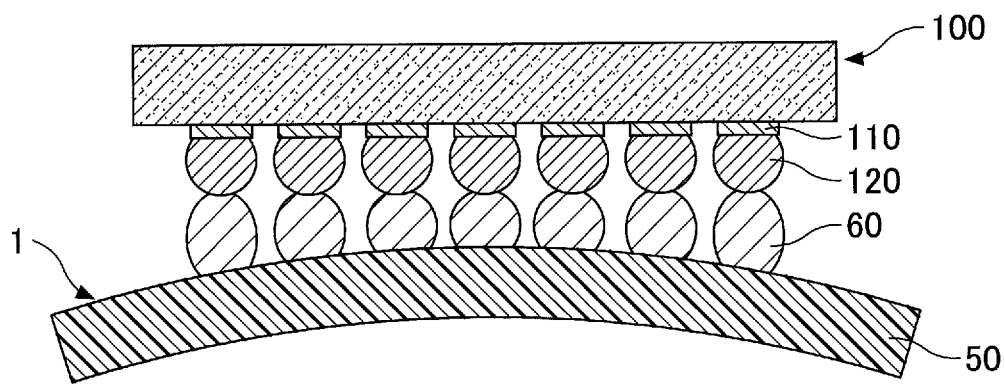

As illustrated in FIG. 6B, when the semiconductor chip 100 is mounted on the chip mounting region S of the wiring board 1, the short-circuit and the open-circuit are less likely to occur, because the positions of the vertexes of the solder bumps 60 are approximately constant from the center part toward the outer peripheral part of the chip mounting region S. In other words, because the positions of the vertexes of the solder bumps 60 are approximately constant from the center part toward the outer peripheral part of the chip mounting region S, the corresponding pad 40 and electrode 110 are positively connected by the corresponding solder bumps 60 and 120 that are melted and thereafter coagulated to cause alloying and achieve the electrical connection. Accordingly, it is possible to improve the reliability of the connection between the wiring board 1 and the semiconductor chip 100 in a semiconductor device in which the semiconductor chip 100 is mounted on the chip mounting region S of the wiring board 1.

In the example described above, the chip mounting region S is segmented into the four segmented regions n, n−1, n−2, and n−4. However, the chip mounting region S may be segmented into two or three segmented regions, or into five or more segmented regions, by taking into consideration the amount of warp in the chip mounting region S. In other words, the chip mounting region S may be segmented into an arbitrary number of segmented regions, as long as the inconsistencies in the positions of the vertexes of the solder bumps 60 along the height direction caused by the convex warp at the center part of the chip mounting region S can be canceled.

Second Embodiment

In a second embodiment, a wiring board 2 is warped in a direction opposite to the direction in which the wiring board 1 of the first embodiment is warped. In the second embodiment, those parts that are the same as those of the first embodiment are designated by the same reference numerals, and a repeated description of the same parts may be omitted.

FIG. 7 is a cross sectional view, in part, illustrating an example of the wiring board in the second embodiment. As illustrated in FIG. 7, the wiring board 2 has the same layer structure as that of the wiring board 1. However, in the wiring board 2, the depth of the cavity 40x formed in the pad 40 that is arranged in the center part of the chip mounting region S is the shallowest, and the depth of the cavity 40x formed in the pads 40 becomes deeper toward the outer edge of the chip mounting region S.

Figure 8A:
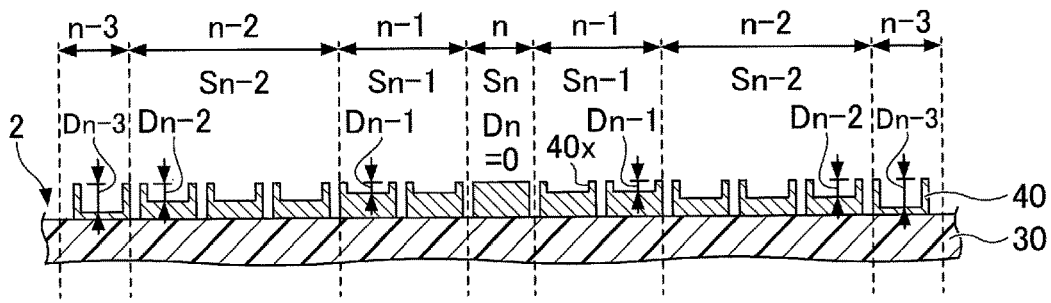
FIG. 8A, FIG. 8B, and FIG. 8C are diagrams for explaining the cavities formed in the pads of the wiring board in the second embodiment.
Figure 8B:
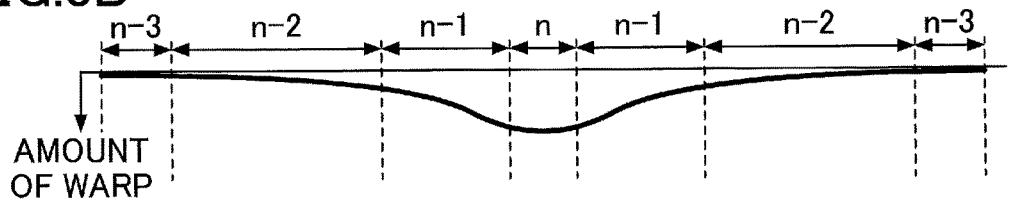
Figure 8C:
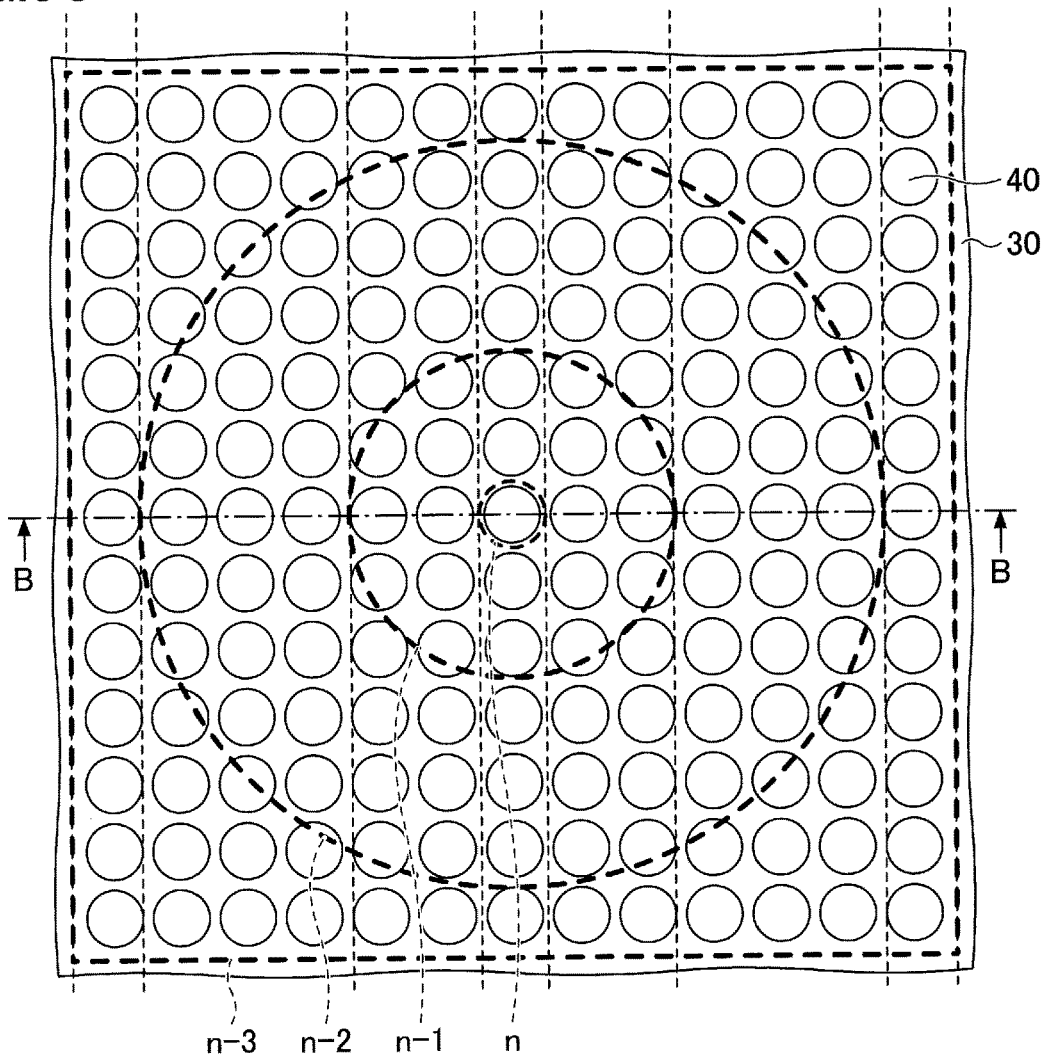

FIG. 8A, FIG. 8B, and FIG. 8C are diagrams for explaining the cavities formed in the pads of the wiring board in the second embodiment. More particularly, FIG. 8A is a cross sectional view, in part, illustrating a vicinity of the chip mounting region S, FIG. 8B is a diagram illustrating an amount of warp in the vicinity of the chip mounting region S, and FIG. 8C is a plan view, in part, illustrating the vicinity of the chip mounting region S. FIG. 8A illustrates the cross section along a line B-B in FIG. 8C. It is assumed for the sake of convenience in FIG. 8A that the cavity 40x has a rectangular cross sectional shape. In addition, FIG. 8B illustrates the amount of warp in the cross section along the line B-B in FIG. 8C. Further, illustration of the cavities 40x is omitted in FIG. 8C.

As illustrated in FIG. 8B, the chip mounting region S of the wiring board 2 is warped so that the side of the pads 40 forms a concave shape. Depending on the layer structure of the wiring board 2, the materials forming each of the layers, and conditions such as coarse or dense distribution of the wirings, the chip mounting region S may warp in the concave shape instead of the convex shape.

In the wiring board 2, the width of the segmented regions, the depths of the cavities 40x, and the relationship of the width of the segmented region and the depth of the cavity 40x between the adjacent segmented regions may be determined by taking into consideration the features of the concave warp illustrated in FIG. 8B, so that the vertex positions of the solder bumps lie approximately on the same plane when the solder bumps having the constant volume are formed on each of the pads 40.

More particularly, the width $S_n$ of the segmented region n is the narrowest, the width $S_{n-1}$ of the segmented region n−1 is wider than the width $S_n$, and the width $S_{n-2}$ of the segmented region n−2 is wider than the width $S_{n-1}$. In other words, among the segmented regions n, n−1, and n−2 of the chip mounting region S, excluding the outermost segmented region n−3, the width of the segmented region becomes wider toward an outer edge of the chip mounting region S. Further, among the segmented regions n, n−1, and n−2 of the chip mounting region S, excluding the outermost segmented region n−3, a difference between the widths of the adjacent segmented regions becomes larger toward the outer edge of the chip mounting region S. Accordingly, the relationship $S_{n-1}-S_n < S_{n-2}-S_{n-1}$ stands.

A depth $D_n$ of the cavity 40x formed in the pad 40 that is arranged in the segmented region n is the shallowest and $D_n=0$, a depth $D_{n-1}$ of the cavity 40x formed in each pad 40 that is arranged in the segmented region n−1 is deeper than the depth $D_n$, and a depth $D_{n-2}$ of the cavity 40x formed in each pad 40 that is arranged in the segmented region n−2 is deeper than the depth $D_{n-1}$. For example, the depths of the cavities 40x may be $D_n=0$ μm, $D_{n-1}=7$ μm, $D_{n-2}=12$ μm, and $D_{n-3}=15$ μm.

Hence, among the segmented regions n, n−1, n−2, and n−3 of the chip mounting region S, the depth $D_n$ of the cavity 40x formed in the pad 40 that is arranged in the segmented region n is the shallowest, and the depth of the cavity 40x formed in the pads 40 becomes deeper toward the outer edge of the chip mounting region S. Further, a difference between the depths of the cavities 40x formed in the pads 40 that are arranged in the adjacent segmented regions becomes smaller toward the outer edge of the chip mounting region S. Accordingly, a relationship $D_{n-1}-D_n > D_{n-2}-D_{n-1} > D_{n-3}-D_{n-2}$ stands.

A ratio of the difference between the widths of the adjacent segmented regions, to the difference between the depths of the cavities 40x formed in the pads 40 that are arranged in the adjacent segmented regions, becomes smaller toward the outer edge of the chip mounting region S. In other words, a relationship $(D_{n-1}-D_n)/(S_{n-1}-S_n) > (D_{n-2}-D_{n-1})/(S_{n-2}\ S_{n-1})$ stands.

Similarly as in the case described above in conjunction with FIG. 6A and FIG. 6B, when the semiconductor chip 100 is mounted on the chip mounting region S of the wiring board 2, the short-circuit and the open-circuit are less likely to occur, because the positions of the vertexes of the solder bumps 60 are approximately constant from the center part toward the outer peripheral part of the chip mounting region S. In other words, because the positions of the vertexes of the solder bumps 60 are approximately constant from the center part toward the outer peripheral part of the chip mounting region S, the corresponding pad 40 and electrode 110 are positively connected by the corresponding solder bumps 60 and 120 that are melted and thereafter coagulated to cause alloying and achieve the electrical connection. Accordingly, it is possible to improve the reliability of the connection between the wiring board 2 and the semiconductor chip 100 in a semiconductor device in which the semiconductor chip 100 is mounted on the chip mounting region S of the wiring board 2.

Accordingly to each of the embodiments described above, it is possible to improve the reliability of the connection between the wiring board and the semiconductor device when mounting the semiconductor chip on the wiring board.

Various aspects of the subject-matter described herein may be set out non-exhaustively in the following numbered clauses:

1. A method of manufacturing a wiring board having an insulating layer, a plurality of pads formed on a surface of the insulating layer, and a chip mounting region defined on a surface of the wiring board formed with the plurality of pads, the method comprising:

forming the plurality of pads in the chip mounting region; and forming a cavity, in a surface of at least some of the plurality of pads, so that the cavity caves in, from the surface of the at least some of the plurality of pads, toward the insulating layer, wherein the forming the cavity segments the chip mounting region into a plurality of segmented regions, and varies a depth of the cavity for each of the plurality of segmented regions.

2. The method of manufacturing the wiring board according to clause 1, further comprising:

forming a solder resist layer on the surface of the insulating layer, to cover the plurality of pads arranged in the chip mounting region;

forming first openings in the solder resist layer to expose a surface of each of the plurality of pads;

forming a resist layer, including second openings, on the solder resist layer so that the second openings communicate to at least some of the first openings; and forming cavities using the resist layer as a mask, by etching the at least some of the plurality of pads from the surface thereof exposed within the first openings and the second openings, wherein the forming the resist layer varies an opening area of the second opening for each of the plurality of segmented regions, and wherein the forming the cavities forms the cavities deeper for the pads exposed within the second openings having larger opening areas.

3. The method of manufacturing the wiring board according to clause 1 or 2, wherein the chip mounting region is warped so that a side of the plurality of pads forms a convex shape, the chip mounting region is segmented into the plurality of segmented regions from a center part toward an outer peripheral part of the chip mounting region, and a depth of the cavity formed in the pad that is arranged in the segmented region at the center part is deepest, and depths of cavities formed in the pads that are arranged in the segmented regions closer to an outer edge of the chip mounting region are shallower.

4. The method of manufacturing the wiring board according to clause 1 or 2, wherein the chip mounting region is warped so that a side of the plurality of pads forms a concave shape, the chip mounting region is segmented into the plurality of segmented regions from a center part toward an outer peripheral part of the chip mounting region, and a depth of the cavity formed in the pad that is arranged in the segmented region at the center part is shallowest, and depths of cavities formed in the pads that are arranged in the segmented regions closer to an outer edge of the chip mounting region are deeper.

The description above use terms such as "determine", or the like to describe the embodiments, however, such terms are abstractions of the actual operations that are performed. Hence, the actual operations that correspond to such terms may vary depending on the implementation, as is obvious to those skilled in the art.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
an insulating layer;
a plurality of pads formed on a surface of the insulating layer; and
a chip mounting region defined on a surface of the wiring board formed with the plurality of pads,
wherein the plurality of pads are arranged in the chip mounting region,
wherein a cavity is formed in a surface of at least some of the plurality of pads,
wherein the cavity caves in, from the surface of the at least some of the plurality of pads, toward the insulating layer, and
wherein the chip mounting region is segmented into a plurality of segmented regions, and a depth of the cavity is different for each of the plurality of segmented regions.

2. The wiring board as claimed in claim 1, wherein
the chip mounting region is warped so that a side of the plurality of pads forms a convex shape,
the chip mounting region is segmented into the plurality of segmented regions from a center part toward an outer peripheral part of the chip mounting region, and
a depth of the cavity formed in the pad that is arranged in the segmented region at the center part is deepest, and depths of cavities formed in the pads that are arranged in the segmented regions closer to an outer edge of the chip mounting region are shallower.

3. The wiring board as claimed in claim 2, wherein a difference between the depths of the cavities in adjacent segmented regions is smaller toward the outer edge of the chip mounting region.

4. The wiring board as claimed in claim 2, wherein widths of the plurality of segmented regions are wider toward the outer edge of the chip mounting region, except for an outermost segmented region of the chip mounting region.

5. The wiring board as claimed in claim 4, wherein a difference between the widths of the adjacent segmented regions is larger toward the outer edge of the chip mounting region, except for an outermost segmented region of the chip mounting region.

6. The wiring board as claimed in claim 1, wherein
the chip mounting region is warped so that a side of the plurality of pads forms a concave shape,
the chip mounting region is segmented into the plurality of segmented regions from a center part toward an outer peripheral part of the chip mounting region, and
a depth of the cavity formed in the pad that is arranged in the segmented region at the center part is shallowest, and depths of cavities formed in the pads that are arranged in the segmented regions closer to an outer edge of the chip mounting region are deeper.

7. The wiring board as claimed in claim 6, wherein a difference between the depths of the cavities in adjacent segmented regions is smaller toward the outer edge of the chip mounting region.

8. The wiring board as claimed in claim 6, wherein widths of the plurality of segmented regions are wider toward the outer edge of the chip mounting region, except for an outermost segmented region of the chip mounting region.

9. The wiring board as claimed in claim 8, wherein a difference between the widths of the adjacent segmented regions is larger toward the outer edge of the chip mounting region, except for an outermost segmented region of the chip mounting region.

10. The wiring board as claimed in claim 1, wherein the plurality of pads include pads having no cavity formed therein.

11. A semiconductor device comprising:
a wiring board according to claim 1; and
a semiconductor chip, including a plurality of electrodes, mounted on the chip mounting region of the wiring board,
wherein the plurality of pads of the wiring board respectively are electrically connected to the plurality of electrodes of the semiconductor chip, via solder bumps.

12. The semiconductor device as claimed in claim 11, wherein positions of vertexes of the solder bumps on the wiring board are approximately constant from a center part toward an outer peripheral part of the chip mounting region.

* * * * *